United States Patent [19]

Lampert et al.

[11] 4,123,718

[45] Oct. 31, 1978

[54] SSMA RECEIVER WITH SYNCHRONOUS DEMODULATION AND VARIABLE GAIN CONTROL

[75] Inventors: Ernst Lampert, Unterpfaffenhofen; Helmut Mahner, Munich, both of Germany

[73] Assignee: Siemens Aktiengesellschaft, Berlin & Munich, Germany

[21] Appl. No.: 184,238

[22] Filed: Sep. 27, 1971

[30] Foreign Application Priority Data

Sep. 30, 1970 [DE] Fed. Rep. of Germany ....... 2048056

[51] Int. Cl.$^2$ .......................... H03D 3/18; H04B 1/10
[52] U.S. Cl. ....................................... 325/474; 325/65; 325/404; 325/408; 325/473; 329/50
[58] Field of Search ................... 325/32, 345, 408, 65, 325/473, 474, 404; 329/50, 134, 122; 328/133; 178/5.4 SD

[56] References Cited

U.S. PATENT DOCUMENTS

| | | | |
|---|---|---|---|
| 3,210,667 | 10/1965 | Hern et al. | 325/408 |
| 3,376,514 | 4/1968 | Womack et al. | 329/50 |
| 3,478,268 | 11/1969 | Coviello | 325/474 |
| 3,617,892 | 11/1971 | Hawley et al. | 325/7 |
| 3,646,252 | 6/1970 | Verstraelen et al. | 329/50 |
| 3,678,393 | 7/1972 | Newell | 325/404 |
| 3,706,933 | 12/1972 | Bidell et al. | 325/474 |

*Primary Examiner*—Howard A. Birmiel
*Attorney, Agent, or Firm*—Hill, Gross, Simpson, Van Santen, Steadman, Chiara & Simpson

[57] ABSTRACT

A receiver for electric oscillations modulated in SSMA technique with which, in an intermediate frequency position, a multiplier is provided for multiplying the intermediate frequency signal with a code which is to be received, and with which a synchronous demodulator for obtaining the information to be received is connected to the multiplier, wherein the receiver includes in a section preceding the multiplier a gain control amplifier having two control voltage derivation circuits assigned thereto for deriving control signals, one of the voltage derivation circuits operable to evaluate the output signal of the multiplier and other of the voltage derivation circuits operable to evaluate the output of a synchronous demodulator so that in an unsynchronized state of the synchronous demodulator the control signal which is derived from the multiplier output serves to control the gain control amplifier and in the case of synchronous operation the control signal derived from the synchronous demodulator is employed to control the gain control amplifier.

5 Claims, 4 Drawing Figures

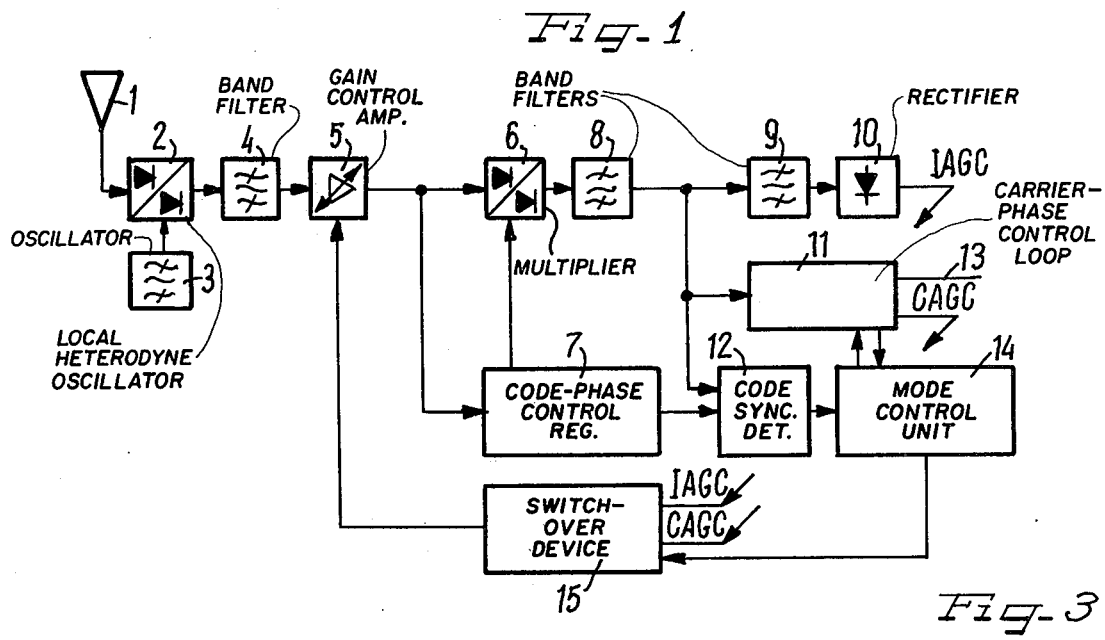
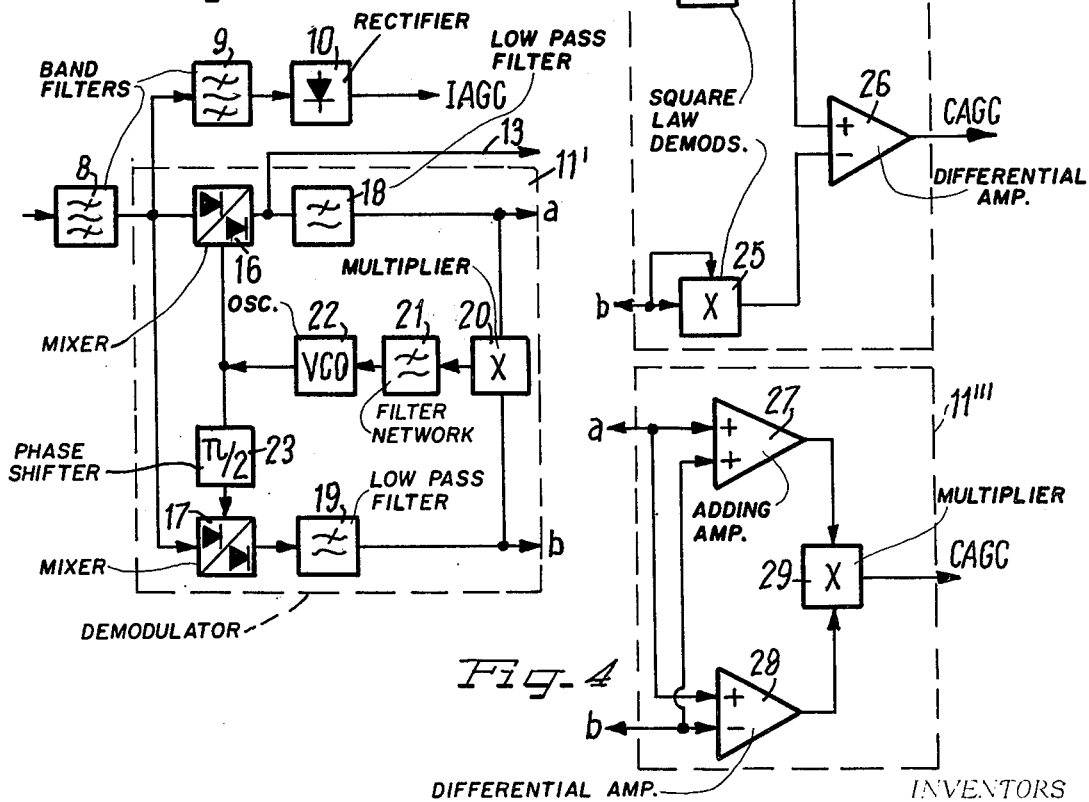

SSMA RECEIVER WITH SYNCHRONOUS DEMODULATION AND VARIABLE GAIN CONTROL

DESCRIPTION

This invention relates to a receiver for electric oscillations modulated in accordance with SSMA techniques, which receiver, in an intermediate frequency position, is provided with a multiplier for multiplying the intermediate frequency signal with a signal modulated with the code to be received, and with a demodulator connected to the multiplier for obtaining the information which is to be received.

The SSMA technique is a transmission method in which information is artificoally expanded in the frequency band, and this radio frequency are is utilized by several stations simultaneously for transmission purposes. The expression "SSMA" is derived from the term "Spread-Spectrum-Multiple-Access-Modulation". The SSMA method is primarily applied in communications satellite transmission paths having multiple access capabilities. This technique is described in detail, for example, in the publication "Proceedings of the IEEE", volume 54, (1966), pp. 763-777. It is essential with the SSMA technique that a fairly large number of transmission stations operate in the same radio frequency area, and that the symbols which are transmitted from the individual stations respectively have a particular code modulation which is unique to a station. This modulation code has two objectives, namely, on the one hand to expand the individual signal to a fairly large frequency area, and on the other hand to render the individual signal recognizable to a certain receiving station. Therefore, it is possible, with respect to the individual receiver, to screen out a certain transmitting station from the frequency spectrum on the basis of the code signal received from the transmitting station. The code symbol of the individual station is therefore a relatively large symbol which includes, for example, 10 Mega Bits. The individual character is most often expressed by a phase change of the transmitted high frequency oscillations with reference to the respectively preceding bit. The information itself is additionally impressed onto a code symbol in the transmitting station; more specifically this is accomplished by applying rapid phase change modulation in such a manner that the code symbol, which includes relatively many Bits, is inverted in its phase with respect to essentially fewer bits when a sign change occurs in the information flow. On the receiving side, the code symbol is produced in a code generator which runs synchronously with the transmitting side and is submitted to a multiplying process in the radio frequency position along with the received signal, or, and is most often the case, in the intermediate frequency position. In case of the reception of the code which has not been changed by any additional information, the signal power will only appear in the form of a single spectral line due to the multiplication process. If the code signal is changed on the transmitting side by means of inverting individual rapid phase changes in the rhythm of information which includes only a few bits compared to the code symbol, an information will be obtained instead of the individual frequency component when the unchanged code symbol is received. This includes all frequency components which correspond to the information on the transmitting side. When several transmitting stations operate simultaneously and jointly in the same frequency area, additional frequencies occur after the multiplication process with a power which, however, is essentially less than that of the useful signal, in the usual case, and which can be grouped as noise with respect to the desired information. Thus, devices are required both on the transmission side and on the receiving side which operate in accordance with the SSMA technique and which produce a phase-modulated electric oscillation, whereby it is particularly important that the carrier signal itself is suppressed as far as possible in order to prevent interfering frequencies received in the receiver from causing an undesired frequency transformation and/or multiplication. However, an essential problem of such devices is that few transmitters may be operated in the radio frequency range at a certain time of operation, while at another time of operation a very large number of individual transmitters may be active in the radio frequency range. This is valid in particular with satellite connections in which, as is well known, the individual transmission paths extend from the ground station to a transponder in a satellite and from the transponder again to another ground station. In such satellite connections, the transponder in the satellite is provided with a device for keeping the output power constant so that it is independent of the number of transmissions stations which send their information at a given moment to be processed by the satellite. This again causes the satellite signal received on the ground to have an almost constant level. If the system operates only with the information of one individual ground station transmitting place, the entire available power is at the disposal of the individual channel. But, if a fairly large number of transmitting stations operate in the direction toward the satellite at the same time, it is possible that the power available for the individual transmission channel is up to 45 dB below the sum-transmission power of the satellite. This usually requires the SSMA demodulator in the receiver to be able to process useful signals with a level uncertainty or fluctuation of the input level of about 60 dB. One might try to produce an equilization or balance of these level fluctuations by means of usual amplification regulation techniques, but it has been proven that these difficulties cannot be opposed to a sufficient degree in this manner.

According to the present invention, the above difficulty is overcome through the provision of a receiver for electric oscillations, which have been modulated in accordance with the SSMA technique, which receiver has, in an intermediate frequency position, a multiplier for multiplying the intermediate frequency signal with a signal which is modulated with the code to be received. The receiver also includes a demodulator connected to the multiplier for obtaining the information to be received, and variable gain amplifier is provided preceding the multiplier and controlled by the output of the multiplier in an unsynchronized state of the demodulator and by the demodulator in the case of synchronized operation of the demodulator.

This invention is based on a recognition that the demodulator in an SSMA receiver requires two control loops for the demodulation process, namely a code phase followup control loop for maintaining the code synchronization and a carrier phase followup control loop for synchronizing the received carrier oscillation with the carrier oscillation produced in the receiver, and that only then an optimum behavior is guaranteed in the presence of noise disturbed signals when both of these two control loops are supplied with an input level at a very precise value. The initially mentioned fluctuations of 60 dB and 15 dB (the normally maximum total signal variation), however, make the realization of this demand very questionable. Common amplitude control circuits which derive a control signal from the output of the intermediate frequency receiver portion by means of rectification are not able to meet these difficulties since the intermediate signal contains a varying proportion of useful signals, depending on the number of transmitting stations operating in the radio frequency range and due to the transmitting power limitation, for example, in the satellite transponder. However, one will effectively meet these difficulties with a construction of a control device in accordance with the teachings of the present invention.

It is advantagenous when the gain control derivation device which is connected directly to the output of the multiplier contains a filter device for limiting the frequency band to a value in the order of magnitudes of the double bit rate of the information signal which is to be received, and when obtaining the control signal is effected by means of rectifying the signal which can be taken from the output of the filter.

It is a further advantage when a circuit for detecting the code synchronization is connected to the output of the multiplier in parallel with the demodulator, and when furthermore a mode control unit is provided which accepts the output signal of this circuit on the one hand as an input signal and on the other hand a corresponding signal from the demodulator, and when further the control unit causes the switching over of the control signals which control the operation of the control amplifier (AGC amplifier).

It is a further advantage to make the design of the apparatus in such a manner that the circuit for performing demodulation is a synchronous demodulator circuit, and that a square-law demodulator is connected to each of its quadrature channels, and that the output signals of the two square-law demodulators are comprised in a differential amplifier whose output signal serves as a gain control signal. Another advantageous solution of this circuit resides in the application of a synchronous demodulator circuit as the demodulator, a differential amplifier and an addition amplifier connected in parallel to the two quadrature branches of the synchronous demodulator with their outputs connected to a multiplier whose output signals serve as a gain control signal.

Other objects, features and advantages of the invention will be best understood from the following detailed description of particular embodiments thereof taken in conjection with the accompanying drawing, in which FIG. 1 a schematic block diagram of a receiver constructed in accordance with the principles of the present invention;

FIG. 2 is a block circuit diagram of a synchronous demodulator;

FIG. 3 illustrates a first circuit for deriving a gain control signal from the synchronous demodulator; and FIG. 4 illustrates a further circuit for deriving a gain control signal from a synchronous demodulator.

With the receiver illustrated in FIG. 1, by way of an antenna 1, a radio frequency signal which, for example, covers a frequency range of 7250–7270 MHz, is received and extended to a local oscillator 2, which oscillator 2 also receives a heterodyne oscillation at a frequency of 7190 MHz from an oscillator 3. At the output of the local oscillator 2, the intermediate frequency signal with a frequency of 70 MHz ± 10 MHz is applied to a band filter 4, and then extended to a gain control amplifier 5, which is also commonly known by the terms regulating amplifier, control amplifier, servoamplifier, and adjusting amplifier. From the output of the gain control amplifier 5, the intermediate frequency signal is, on the one hand, applied to the aforementioned multiplier 6 and, on the other hand, the signal is applied to a code phase followup regulator 7. In the code phase followup regulator 7, the code of the transmitting station which is to be received is produced and simultaneously modulated onto a carrier signal and applied to the multiplier 6. This carrier signal which is extended from the code phase followup regulator 7 to the multiplier 6, is frequency different with respect to the intermediate frequency signal at the input of the multiplier 6, namely in such a way that the output of the multiplier 6 provides a second intermediate frequency signal, for example, in the frequency position about the frequency of 20 MHz. The useful signal, which is produced by the multiplication process on the multiplier 6, is screened out with the aid of a band filter 8, whose band width is small compared with the first intermediate frequency band width, but still large compared with the band width which is determined by the bit succession frequency of the information itself. With the sample embodiment, illustrated herein, the band width of a band filter 8 in an operational circuit was about 50 kHz. A further band filter 9 is connected to output of the band filter 8 and its band width is again essentially smaller and about in the order of magnitude of the double bit rate of the information which is to be evaluated. In the sample embodiment, the band width of this filter was between 1 kHz and 10 kHz. The band width may be varied according to particular demands. A rectifier 10 is connected to the output of the band filter 9 and provides one of the two initially-mentioned gain control signals as a direct current output signal. This control signal is referenced IAGC in this sample embodiment. A carrier phase followup control loop 11 and a circuit 12 for detecting the code synchronization are connected to the output of the band filter 8 in parallel to the band filter 9. The carrier phase followup control loop 11 includes the demodulator itself in the form of a so-called synchronous demodulator. According to this technique, the information which is to be obtained from the received signal is made available at the output 13. The other of the two initially mentioned gain control signals is referenced CAGC in FIG. 1, and is derived from the synchronous demodulator in a manner which will be explained below with reference to FIGS. 3 and 4.

A mode control unit 14 is provided and fed by the control loop 11 and by the circuit 12 for detecting code synchronization. This mode control unit 14, one the one hand, feeds the control loop 11 and, on the other hand, causes a switch-over device 15 to supply the respectively correct one of the two control signals to the gain control amplifier 5. The control signal IAGC, on the one hand, and, the control signal CAGC, on the other hand, are fed to the switch-over device 15. This switch-over device 15 causes the signal IAGC to be utilized in the absence of carrier synchronization and the signal CAGC to be utilized during times of carrier synchronization, and the transfer is effected due to the corresponding criterion of the mode control unit 14.

The switch-over device 15, can therefore also attain additional circuit elements for influencing the regulating behavior. Hereby, it should be mainly taken into account that the circuit 15 should be provided with a so-called integral regulator.

The succession of carrier phase synchronization and the code synchronization is effected in such a receiver in accordance with the following tabulation:

|   |   | I | II | III |
|---|---|---|---|---|
| A | Code synchronization (CS) and carrier synchronization (TS) | not present | CS present TS not present | CS and TS present |
| B | output signals from 12 | not present |   | present |
| C | signal from 14 to 11 | not present |   | present |
| D | signal 11 to 14 | not present | not present | present |
| E | control signal evaluated in 15 | IAGC | IAGC | CAGC |
| F | level at outlet of 4 |   | level fluctuates around desired value such as ± 8 dB |   |
|   | level at outlet of 8 | sum level constant, useful level not determined | summed level fluctuates for instance around 25 dB; useful level fluctuates around 5 dB and is below summed level. | useful level constant; summed level fluctuates and may be above useful level, for instance, above 25 dB. |

Line A shows the typical succession of the possible operational states of an SSMA receiver. First of all, the receiver is entirely unsynchronized. Since the code synchronization (CS) is missing, no carrier synchronization (TS) is possible. In this state I, the code phase of the code generator in the code phase followup regulator 7 is changed until synchronization occurs. The code phase coincidence is recognized by the circuit 12. The signal is then present at the outputs of the circuit 12 (see line B). This signal, one one hand, serves for informing the code phase followup control loop 7 that the state II "CS present but TS not yet present" is provided. The same information is also given to the mode control unit 14. The mode control unit 14 transfers this information to the carrier phase followup control loop 11 (see line C). In the carrier phase followup control loop 11, the carrier synchronization is then acquired. The state III "CS and TS present" is recognized by the mode control unit 14 when the carrier phase followup control loop 11 transfers a signal to the mode control unit 14. This signal occurs when carrier synchronization is present (see line D). As shown in line E, the receiver operates in states I and II with the gain control signal IAGC and only after the mode control unit 14 has recognized the state III, is the switch-over to the gain control signal CAGC effected. If carrier synchronization is lost with a present code synchronization, the state II will occur again. If both the carrier synchronizatuon TS and the code synchronization CS are lost, the operational state I will occur again.

Independent from the operational state, the summed level (line F) may fluctuate in the intermediate frequency position on the output of the filter 4 at about, for example, ± 8 dB with respect to its nominal value. A fixed summed signal level will occur at the output of the filter 8 in the state I, which is usually above the useful signal level required in the state III. The size of the useful level is entirely undetermined in the state I. In the state II, the summed signal level, with respect to state I, decreased slightly and, as opposed to state I, has no fixed value but fluctuates depending on the size of the useful portion of the signal, for example, in an area of about 25 dB. These fluctuations occur while the useful signal is held within a range of about 5 dB. In state III, the receiver operates with the gain control signal CAGC. Thus, the useful signal is brought to a fixed given value, and the summed signal level also increases with respect to state II, as has been shown in line G.

In FIG. 2, a demodulation circuit is illustrated which, in addition to demodulation of the phase modulated signals, is also applied for deriving a control signal. With the circuit according to FIG. 2, the filters 8 and 9 and the rectifier 10 of FIG. 1 are also illustrated in order to characterize the connection of the demodulator circuit. The demodulator itself has been referenced 11' in FIG. 2 and the apparatus which is connected subsequent to the circuit 11' is illustrated in FIG. 3 and referenced 11". A variation of the circuit 11" is illustrated in FIG. 4 and referenced 11'''. The connection points between the circuits 11' and either of the circuits 11" and 11''' are indicated by the lower case reference characters $a, b$. The demodulator circuit 11' in itself is known and described, for example, in the publication "Proceedings of the IRE", 1956, pp. 1713–1718. It is usually applied for the demodulation of two-sided band amplitude modulation signals with suppressed carrier. A so-called phase-shift keyed signal (PSK-signal) may be regarded as such a modulated signal with suppressed carrier and a circuit which has been described in the above mentioned literature passage is also applicable for the demodulation of such phased signals. The demodulation circuit includes two mixers 16,17 which serve for transposing the frequency of their input signals into the base band position. Low-pass filters 18,19 are connected to respective outputs of the mixers 16,17 and only transmit the base band. The output signals of the low-pass filters are applied to a multiplier 20. A generator 22 is provided to supply the mixers 16,17 with signals having a 90° phase difference, a signal will be provided at the output of the multiplier 20 which is free from any modulation portions. This is due to the fact that a base band signal in the output of the filter 18, multiplied with the cosine of a phase angle $\phi$, which will be further explained below, is available while at the output of the band filter 19, the base signal is provided, multiplied with the sine of this phase angle $\phi$. The phase angle $\phi$ is the phase difference between the carrier oscillation provided at the output of the filter 8 and the carrier frequency which is locally produced at the generator 22 and which must be equal in frequency with the carrier oscillation supplied by the filter 8. The signal which is available at the output of the multiplier 20, and which is possibly extended to a filter network 21 for determining the frequency response of the control loop, therefore corresponds exactly to the sine of the double phase difference $2\phi$ and can therefore be applied for the subsequent phase correction of the local oscillator 22, as shown in FIG. 2. If, due to phase shift keying, the phase angle $\phi$ advances at 180°, this signal which depends on the double angle $(2\phi)$ remains unchanged, as opposed to the output signals of the filters 18,19 which, as mentioned above depend on the single angle $\phi$. The entire circuit therefore operates like a synchronous demodulator. The information which is obtained in the base position during the demodulation process can be taken from the output of the mixer 16. The band filter 18, just like the filter 19, usually has a band width corresponding to about triple the value of the bit succession frequency of the original signal. For this reason, it is usually not advisable to receive the base band at the output of the filter 18, since additional distortions of the base band may occur. The base band output is denoted by the reference 13 in FIG. 2.

The gain control signal CAGC is derived from the two quadrature branches of the synchronous demodulator. The two quadrature branches have been given the reference characters a,b. A square law demodulator 24,25 has been connected to each of the two quadrature branches in FIG. 3. In the circuit 11", the output signals of the two square law demodulators 24,25 are connected to a differential amplifier 26, and a gain control signal CAGC may be taken directly from its output. Common square law rectifier type demodulators should usually be suitable demodulators, but it is advisable to apply at this point in the circuit multipliers which are connected as square law rectifiers. For this application it suffices to connect two inputs of a multiplier in parallel and to apply them as a joint input. The demanded signal is then available at the output. The application of such multipliers has the advantage that more dynamic signals may be processed.

Referring to FIG. 4, in the circuit 11', an addition amplifier 27 and a differential amplifier 28 are connected in parallel in the manner illustrated at their inputs, instead of the technique above which utilized two multipliers. The output signals of the two amplifiers 27,28 are connected to a multiplier 29 which provides the gain control signal CAGC.

The demodulator circuit discussed with reference to FIG. 2, and control voltage derivation is of particular advantage for an SSMA receiver which is utilized for rapid phase change modulated signals. This demodulator circuit and standard voltage derivation, however, is also applicable for control purposes and/or with other demodulation objectives such as the reception of rapid phase change modulated signals which are not transmitted in accordance with the SSMA technique. Therefore, although we have described our invention by reference to specific illustrative embodiments, many changes and modifications thereof may become apparent to those skilled in the art without departing from the spirit and scope of our invention, and it is to be understood that we intend to include within the patent warranted hereon all such changes and modifications as may reasonably and properly be included within the scope of our contribution to the art.

What we claim is:

1. A receiver for electric oscillations modulated in accordance with SSMA transmission techniques, comprising
    a multiplier for multiplying an intermediate frequency signal with a code which is to be received;
    a synchronous demodulator for obtaining the information to be received connected to said multiplier;
    a control amplifier connected to and preceding said multiplier;
    a first gain control derivation circuit connected between said multiplier and said control amplifier for controlling the operation of said amplifier in an unsynchronized state of said synchronous demodulator; and
    a second gain control derivation circuit connected between said synchronous demodulator and said control amplifier for controlling the operation of said amplifier when said synchronous demodulator is in a synchronized state.

2. A receiver according to claim 1, wherein said first gain control derivation circuit includes a filtering device for limiting the frequency band width to a value in the order or magnitudes of the double bit rate of the information signal which is to be received, and means for rectifying the output of said filtering device to obtain a control signal for said control amplifier.

3. A receiver according to claim 1 comprising a circuit for detecting code synchronization connected to the output of said multiplier and in parallel with said demodulator, and
    a mode control unit circuit connected to said code synchronization detecting circuit and to said demodulator for determining which of said first or second gain control derivation circuits is effective to control the operation of said control amplifier.

4. Demodulation and gain control derivation apparatus comprising
    a synchronous demodulator including two quadrature channels each having an output for providing quadrature related demodulated signals,
    a differential amplifier, and
    a pair of square law demodulators connected between respective outputs of said synchronous demodulator and said differential amplifier, said differential amplifier operable to provide a gain control signal in response to the output signals of said synchronous demodulator via said square law demodulators.

5. Demodulation and gain control derivation apparatus comprising
    a synchronous demodulator including two quadrature channels each having an output for providing quadrature related demodulated signals,
    a differential amplifier connected to each of said quadrature channels,
    an addition amplifier connected to each of said quadrature channels, and
    a multiplier connected to said differential amplifier and to said addition amplifier for providing an output signal as a gain control signal in response to the output signal of said quadrature channels via said differential and addition amplifiers.

* * * * *